United States Patent
Pihet et al.

(10) Patent No.: US 6,948,847 B2
(45) Date of Patent: Sep. 27, 2005

(54) TEMPERATURE SENSOR FOR A MOS CIRCUIT CONFIGURATION

(75) Inventors: Eric Pihet, München (DE); Michael Glavanovics, Villach (AT); Thomas Krotscheck, Villach (AT); Rudolf Zelsacher, Klagenfurt (AT)

(73) Assignee: Infineon Technologies AG, Munich (DE)

(*) Notice: Subject to any disclaimer, the term of this patent is extended or adjusted under 35 U.S.C. 154(b) by 127 days.

(21) Appl. No.: 10/431,902

(22) Filed: May 8, 2003

(65) Prior Publication Data

US 2003/0210507 A1 Nov. 13, 2003

(30) Foreign Application Priority Data

May 8, 2002 (DE) .......................................... 102 20 587

(51) Int. Cl.⁷ .................................................. G01K 7/01
(52) U.S. Cl. ....................... 374/178; 374/183; 374/208; 327/434; 257/368
(58) Field of Search ................................. 374/178, 170, 374/172, 183; 257/368, 365; 327/434, 512, 513; 702/130

(56) References Cited

U.S. PATENT DOCUMENTS

| | | | | |
|---|---|---|---|---|
| 4,449,224 A | * | 5/1984 | Harari | 377/79 |
| 4,468,634 A | * | 8/1984 | Takagi et al. | 331/60 |
| 4,853,646 A | * | 8/1989 | Johnson et al. | 330/256 |
| 5,095,227 A | * | 3/1992 | Jeong | 327/512 |
| 5,128,731 A | * | 7/1992 | Lien et al. | 257/327 |
| 5,281,872 A | * | 1/1994 | Mori | 327/362 |
| 5,389,813 A | * | 2/1995 | Schwob | 257/469 |
| 5,397,911 A | * | 3/1995 | Hiyama et al. | 257/415 |
| 5,434,443 A | * | 7/1995 | Kelly et al. | 257/467 |
| 5,587,655 A | * | 12/1996 | Oyabe et al. | 323/312 |
| 5,705,837 A | * | 1/1998 | Tanigawa et al. | 257/223 |
| 5,914,629 A | * | 6/1999 | Maki | 327/512 |
| 6,286,886 B1 | * | 9/2001 | Odagaki | 296/65.11 |
| 6,456,104 B1 | * | 9/2002 | Guarin et al. | 324/769 |
| 2002/0179973 A1 | * | 12/2002 | Yamazaki et al. | 257/368 |
| 2004/0027194 A1 | * | 2/2004 | Morishita et al. | 327/543 |
| 2005/0045960 A1 | * | 3/2005 | Takahashi | 257/368 |
| 2005/0074051 A1 | * | 4/2005 | Won et al. | 374/170 |

FOREIGN PATENT DOCUMENTS

| | | |
|---|---|---|
| DE | 38 31 012 A1 | 3/1990 |
| DE | 196 44 193 C2 | 5/1998 |
| DE | 198 05 734 A1 | 8/1998 |
| GB | 2 322 709 A | 9/1998 |

* cited by examiner

*Primary Examiner*—Gail Verbitsky
(74) *Attorney, Agent, or Firm*—Laurence A. Greenberg; Werner H. Stemer; Ralph E. Locher

(57) ABSTRACT

A temperature sensor for a MOS circuit configuration is implemented as the gate of a MOS transistor and configured as a two-terminal network with a gate input and a gate output. By measuring the voltage drop across gate it is possible to determine the temperature at its location.

15 Claims, 4 Drawing Sheets

TEMPERATURE SENSOR FOR A MOS CIRCUIT CONFIGURATION

BACKGROUND OF THE INVENTION

Field of the Invention

The present invention relates to a temperature sensor for a MOS circuit configuration having at least one MOS transistor or at least one transistor cell, wherein, via a gate device, it is possible to determine a voltage drop between a gate input and a gate output.

A temperature sensor for a MOS circuit configuration having at least one MOS transistor, wherein the gate of the transistor is formed as a two-terminal network with a gate input and a gate output in such a way that it is possible to determine the voltage drop between gate input and gate output, is described in German patent application DE 38 31 012 A, for example. Furthermore, U.S. Pat. No. 5,969,927 (German patent DE 196 44 193 C2) describes an overload protection device with a temperature sensor designed as a nonreactive measuring resistor for an integrated component. The measuring resistor is arranged on the gate layer of a MOS power transistor and it is electrically insulated from the gate layer by an intermediate oxide. In this case, the measuring resistor may be arranged in meandering form around transistor cells.

Finally, German patent application DE 198 05 734 A and British patent application GB 2 322 709 A disclose a circuit for measuring the depletion layer temperature of a semiconductor device, wherein a polysilicon resistor integrated into the semiconductor device is used for this measurement.

Final stages of control circuits, for example, such as so-called "low-side" or "high-side" switches, for example, are preferably realized using MOS technology. Such final stages or switches require a temperature sensor which should detect the temperature of the final stage in order to turn the latter off if the temperature exceeds a certain limit value. This is because it is absolutely necessary to avoid the situation wherein the junction temperature of the final stage exceeds the limit value, which has a predetermined value depending on the technology used and is 200° C., for example.

A bipolar transistor is customarily used at the present time for such a temperature sensor. This is because the base-emitter voltage of the transistor is temperature-dependent and can thus be used as a temperature reference for measuring the temperature.

The location of the final stage at which the temperature sensor is positioned in the layout of the MOS circuit configuration forming the final stage poses a certain problem in the case of final stages having relatively large dimensions. In this case, it is possible to integrate the temperature sensor into the final stage, which increases the wiring outlay thereof, or else to arrange the temperature sensor separately besides the final stage. In both possibilities, a certain distance between the temperature sensor and the most temperature-sensitive location of the final stage is unavoidable. In other words, there is necessarily a small temperature gradient between the most temperature-sensitive location in the MOS circuit configuration and the temperature sensor. This temperature gradient cannot be disregarded since, as investigations have shown, temperatures lying a few tens of degrees below the temperature of the most temperature-sensitive location, the so-called final stage temperature, are measured in practical final stages with temperature sensors.

In a dynamic sense, moreover, it must be taken into account that a certain time until the temperature sensor can determine the final stage temperature must always be taken into consideration in a temperature measurement. In other words, in the event of fluctuations in the final stage temperature, these fluctuations are not immediately communicated to the temperature sensor. The latter thus learns of the fluctuations only with a certain time delay.

In order to overcome the difficulties presented above, therefore, at the present time complicated simulations (so-called FEM simulations) are performed which take account of the fact that the temperature sensor is not situated at the most temperature-sensitive location of the MOS circuit configuration and measures the temperature in dynamically delayed fashion. These simulations are complicated and should be avoided as far as possible.

The use of bipolar transistors for temperature measurement is also associated with a further disadvantage: such bipolar transistors are extremely sensitive in terms of their measurement sensitivity relative to fluctuations in the substrate potential or shunt currents on account of, for example, a parasitic NPN transistor between two N-doped epitaxial wells.

SUMMARY OF THE INVENTION

It is accordingly an object of the invention to provide a temperature sensor for a MOS circuit configuration which overcomes the above-mentioned disadvantages of the heretofore-known devices and methods of this general type and which is constructed in a simple manner and allows the most accurate measurement possible of the temperature in a MOS circuit configuration at the most temperature-critical location thereof without complicated simulations.

With the foregoing and other objects in view there is provided, in accordance with the invention, a temperature sensor for a MOS circuit configuration, comprising:

at least one MOS transistor having a gate device with a gate input and a gate output, enabling a determination of a voltage drop between the gate input and the gate output; and the gate device being formed with a plurality of individual gates only partly electrically connected between the gate input and the gate output.

In other words, the objects of the invention are achieved by virtue of the fact that the gate device is split into individual gates, which are electrically connected only partly between the gate input and the gate output. By way of example, if the MOS transistor comprises a multiplicity of cells, then it suffices if, only in individual selected cells, the gates, that is to say the individual gates of the gate device of the MOS transistor overall, serve for temperature measurement and simultaneously as gate electrodes, while the individual gates of the remaining cells only have the function of gate electrodes and are not connected as temperature sensors. Preferably, those individual gate strips—also called gates for short hereinafter—which are situated at particularly temperature-sensitive locations are selected for the temperature measurement.

The MOS transistor may also be, for example, a DMOS transistor wherein the gate electrode is accommodated in a trench and is preferably composed of polycrystalline silicon. In this case, the gate electrode may have a U-shaped course.

In other words, in the temperature sensor according to the invention, the gate of the MOS transistor located at the most temperature-sensitive location of the MOS circuit configuration is used as temperature sensor in that the resistance of the polycrystalline silicon preferably forming the gate is used for the temperature measurement. This advantageously exploits the fact that the gate material of the MOS transistor has a temperature coefficient, so that the temperature at the gate of the MOS transistor can be inferred from the resistance between gate input and gate output.

It is thus possible to arrange the temperature sensor directly at the critical heat source, that is to say the most temperature-sensitive location, in that only the MOS transistor with gate input and gate output which lies nearest to the most temperature-sensitive location of the MOS circuit configuration is operated as temperature sensor. Very accurate temperature measurements are possible in this way since the resistance of especially polycrystalline silicon changes practically linearly with the temperature. However, instead of polycrystalline silicon, it is also possible to choose other materials for the gate. All that is important is that these materials have a certain temperature coefficient of their resistance in the region of the temperatures to be monitored.

Whereas a MOS transistor can usually be represented as a four-terminal network with drain, source, gate and bulk, the temperature sensor according to the invention uses a "five-terminal network" MOS transistor, wherein the gate has a gate input and a gate output, the gate of the MOS transistor being situated between gate input and gate output. If a constant current then flows between gate input and gate output, a voltage drop proportional to the resistance of the gate is obtained across the gate. If the gate is composed of a material, such as polycrystalline silicon, for example, whose resistance changes practically linearly with the temperature in wide temperature ranges of interest, then the change in the voltage drop between gate input and gate output is linearly proportional to the temperature at the location of the gate.

However, it must be taken into account that, in a MOS transistor, the gate voltage is usually used as control voltage of the transistor. The voltage drop between gate input and gate output can be accepted, however, if the voltage drop remains relatively small, which is readily ensured in the case of polycrystalline silicon on account of its relatively high conductivity.

Since, as has already been mentioned, the poly-crystalline silicon preferably used as gate material has relatively low resistance, the gate is preferably configured in strip form between gate input and gate output in order to be able to obtain the albeit relatively small voltage drop desired for the temperature measurement between gate input and gate output.

The function of the temperature sensor should be masked out when the MOS transistor used for temperature measurement in the temperature sensor performs a switching operation. This is because a current flowing between gate input and gate output would impair the switching operation on account of the additional gate charge brought about by the current. Since the temperature measurement usually serves for supplying a logic signal which assumes a high level if a specific temperature Tref is exceeded, and a low level is present for a measured temperature T which is less than the specific temperature Tref, the masking-out can be done for example by performing an ANDing between the signal (T>Tref) and a second logic signal which has a high level during a time which is longer than the switching time of the MOS transistor.

Finally, the temperature sensor according to the invention preferably also has, in addition to the MOS transistor with gate input and gate output, a reference resistor which allows a compensation of manufacture variations and the temperature sensor to measure differential temperatures.

Other features which are considered as characteristic for the invention are set forth in the appended claims.

Although the invention is illustrated and described herein as embodied in a temperature sensor for MOS circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
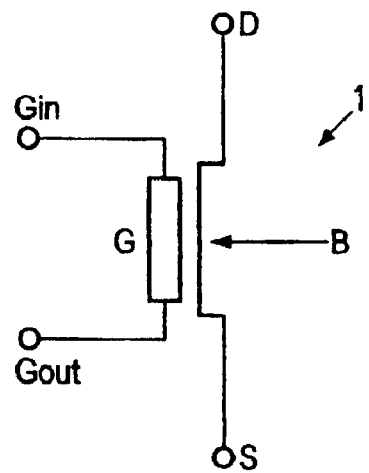
FIG. 1 is a schematic circuit diagram of the temperature sensor according to the invention.

DESCRIPTION OF THE PREFERRED EMBODIMENTS:

Referring now to the figures of the drawing in detail and first, particularly, to FIG. 1 thereof, there is shown a temperature sensor with a MOS transistor 1, which has a drain D, a gate G, a source S, and bulk B. The gate G is provided here with a gate input Gin and a gate output Gout. If the gate G is composed of a material having a temperature coefficient TK, such as polycrystalline silicon, for example, so that there is a temperature dependence of the resistance $R_{Gate}$ on the temperature in a temperature range of interest, or critical temperature range, between 0° C. and 300° C., for example, then the voltage drop measured between the gate input Gin and the gate output Gout can be used for determining the temperature at the location of the gate G of the MOS transistor 1. If the MOS transistor 1 is brought to the location of the heat source, then it is possible to ascertain the temperature of the heat source directly and practically without any time delay, so that simulations can be obviated. Moreover, disturbances due to fluctuations in the substrate potential or shunt currents do not occur since, in the case of a constant current between the gate input Gin and the gate output Gout, a voltage drop which is proportional to the resistance $R_{Gate}$ of the gate G—the resistance changes linearly with the temperature—occurs across the gate G.

Figure 2:
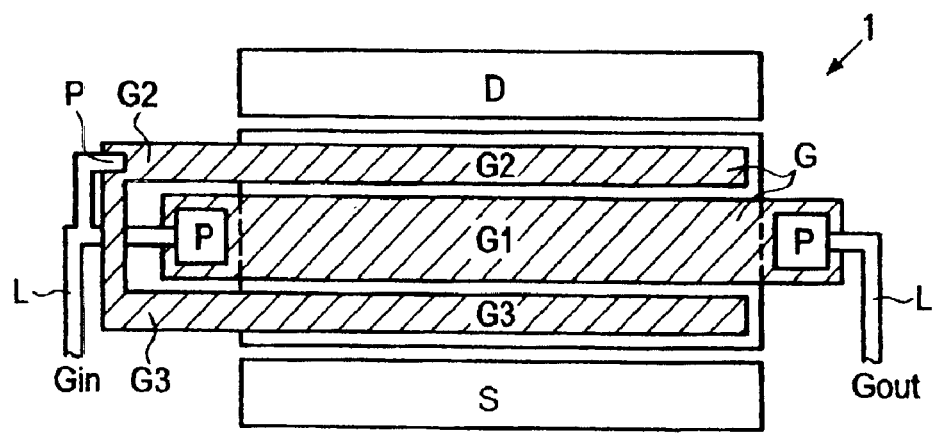
FIG. 2 is a plan view of a MOS transistor with a gate electrode in strip form, serving as a temperature sensor.

The plan view of FIG. 2 shows a MOS transistor 1 as temperature sensor with a strip-type gate G composed of poly-crystalline silicon and comprising gate strips G1, G2 and G3, of which only the gate strip G1 lies between a gate input Gin and a gate output Gout. Interconnects L composed of aluminum, for example, are connected to the gate G at the gate input and the gate output via contact pads P. The splitting of the gate G into the gate strips G1, G2, G3 is carried out in order to increase the electrical resistance. This is achieved in a simple manner by connecting only the gate strip G1 between gate input Gin and gate output Gout. In addition, FIG. 2, schematically shows the drain D with an electrode made, for example, of polycrystalline silicon or aluminum, and the source S.

Figure 2A:
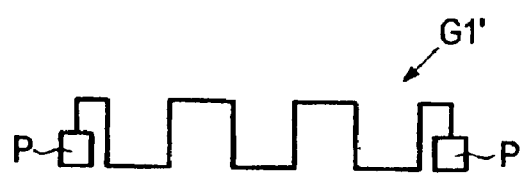
FIG. 2A is a diagram of an alternative embodiment of the gate electrode in meandering form.

The gate strip G1 is illustrated with a straight path in FIG. 2. A meandering configuration or the like may also be chosen, if appropriate, instead of the straight path between the pad P of the gate input Gin and the pad P of the gate output Gout, if a further increase in the resistance $R_{Gate}$ of the gate G is desired. Such a meandering configuration of a gate strip G1' is indicated schematically in FIG. 2A.

Figure 3:
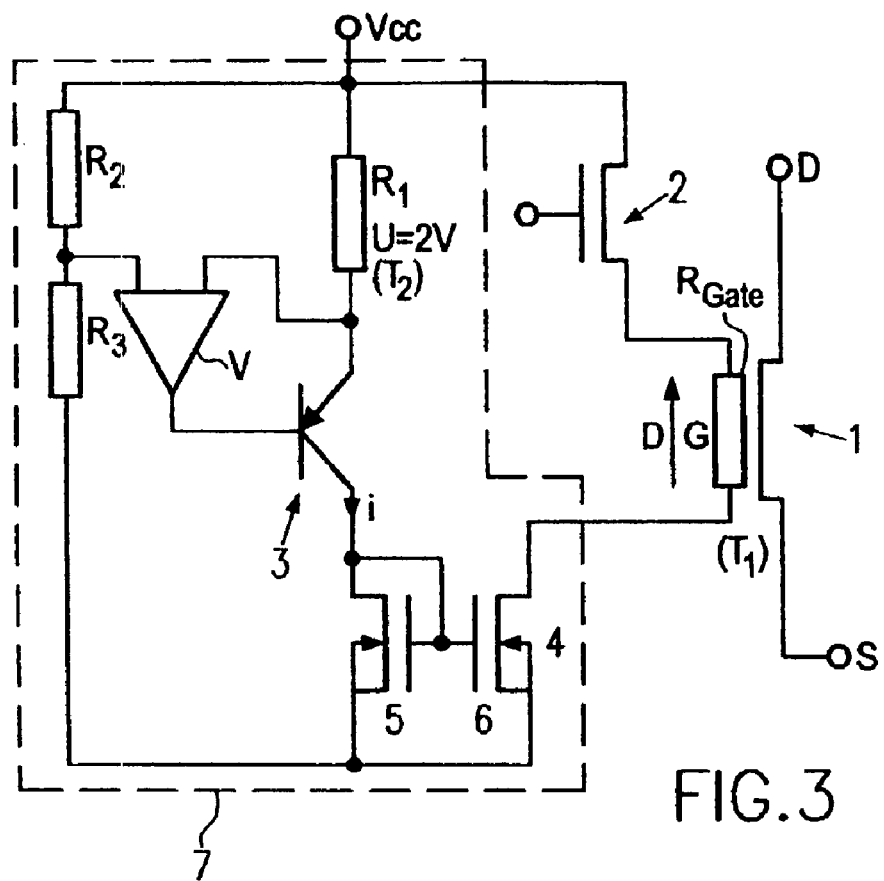
FIG. 3 shows a circuit diagram of a preferred exemplary embodiment for the temperature sensor according to the invention.

FIG. 3 shows a circuit configuration for the temperature sensor having the MOS transistor 1, a transistor 2, which allows a charge to be brought to the gate G of the MOS transistor 1 with a supply voltage Vcc of 5 V, for example, which is independent of temperature fluctuations, and a current generator 7 comprising a reference resistor $R_1$ made, in particular, of the same material as gate G of the MOS transistor 1, that is to say preferably made of polycrystalline silicon, a voltage divider with resistors $R_2$ and $R_3$, a differential amplifier V, a bipolar transistor 3 and an output stage 4 with two further MOS transistors 5 and 6, respectively.

It shall be assumed that the voltage drop across the reference resistor $R_1$ at a temperature $T_2$ has the value 2 V. A current i flowing through the emitter-collector path of the bipolar transistor 3 is then given by:

$$i = \frac{2\,V}{R_1(1 + TK(T_2 - T_0))} \quad (1)$$

where $R_1$ denotes the resistance of the reference resistor $R_1$ and $T_0$ specifies a starting temperature at which the temperature sensor was previously. If the transistors 2, 3, 5 and 6 are in the on state, then the voltage drop U across the MOS transistor 1 is given by:

$$U = 2\,V \frac{R_{Gate}(1 + TK(T_1 - T_0))}{R_1(1 + TK(T_2 - T_0))} \quad (2)$$

In both equations (1) and (2) TK in each case denotes the temperature coefficient of the polycrystalline silicon for gate G of the MOS transistor 1 and, respectively, for the reference resistor $R_1$. In this way, it is possible to use the temperature $T_2$ at the location of the reference resistor $R_1$ as a reference for the temperature $T_1$ at the location of gate G of the MOS transistor 1.

If the transistor 2 is in the off state, then gate G of the MOS transistor is driven only via one terminal, so that the MOS transistor 1 can act as a switching transistor in the non-illustrated circuit connected to the drain D and the source S.

Figure 4:
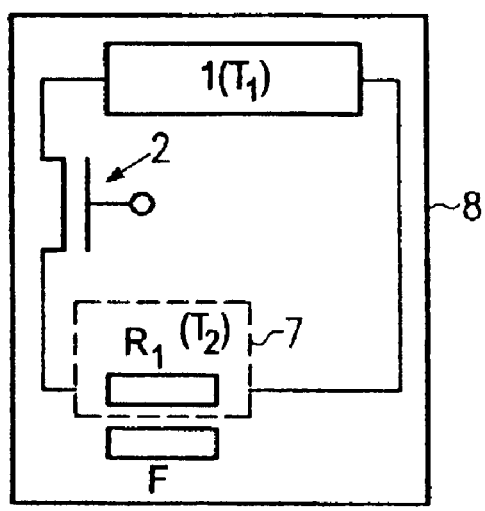
FIG. 4 is a schematic illustration of an exemplary application for the temperature sensor of FIG. 2 in a circuit of FIG. 3.

FIG. 4 shows an application of the temperature sensor 1 of FIG. 2 and the circuit of FIG. 3 with this temperature sensor 1 in a final stage 8. The temperature $T_2$ at the location of the reference resistor $R_1$ is measured or calibrated by a customary temperature sensor F. For this purpose, the temperature sensor F should be provided as far as possible in the vicinity of the reference resistor $R_1$. In this case, the location of the resistor $R_1$ and hence of the temperature sensor F may be noncritical and easily accessible. The temperature $T_2$ is thus fixed. The temperature difference $T_1-T_2$ is then measured by the temperature sensor 1. The temperature $T_1$ at the critical location of the gate G can then be determined from that difference.

The temperature sensor F may be a "slow" sensor since it serves only for calibrating the reference resistor $R_1$. By contrast, the temperature sensor 1 is a fast sensor which allows a rapid and direct temperature measurement at a critical location.

Figure 5:
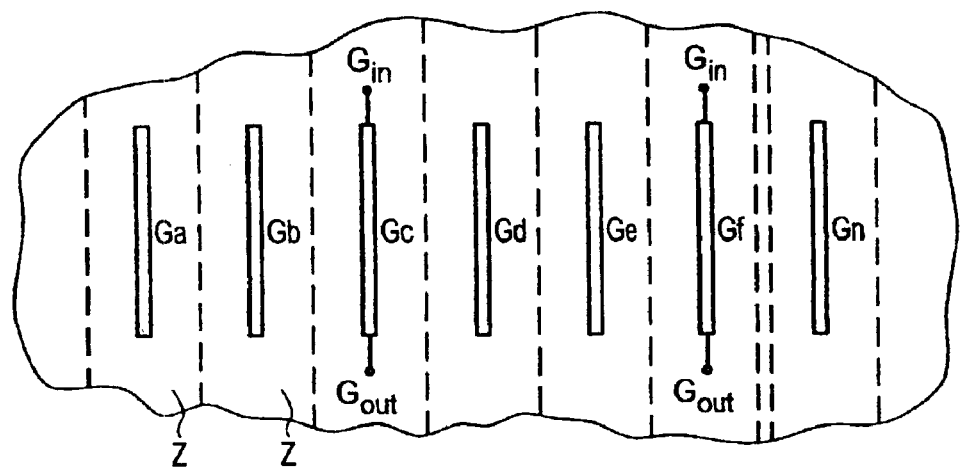
FIG. 5 is a schematic illustration of a multiplicity of individual gates which are each assigned a cell of a MOS transistor.

As has already been mentioned above, in the case of a MOS transistor constructed from a multiplicity of cells, it is possible to use, only in individual cells thereof, the gates thereof, that is to say so-called individual gates, for a temperature measurement in addition to the gate function. In respect of this, FIG. 5 shows in plan view a schematic example of a MOS transistor having individual gates Ga, Gb, Gc, Gd, Ge, Gf . . . Gn which are each assigned a cell Z. The MOS transistor thus comprises a multiplicity of such cells Z and has, for example, a common drain electrode D. A specific number of the individual gates, for example every third individual gate Gc, Gf, . . . , can then be used for temperature measurement and be provided with a gate input Gin and also a gate output Gout. Of course, the individual gates Ga, Gb, Gc, . . . all fulfill their gate function, and only the selected individual gates, in the present example the individual gates Gc, Gf, are additionally operated as a temperature sensor. These individual gates Gc, Gf, etc. can be selected in such a way that they are provided at particularly temperature-critical locations of the MOS transistor.

Figure 6:
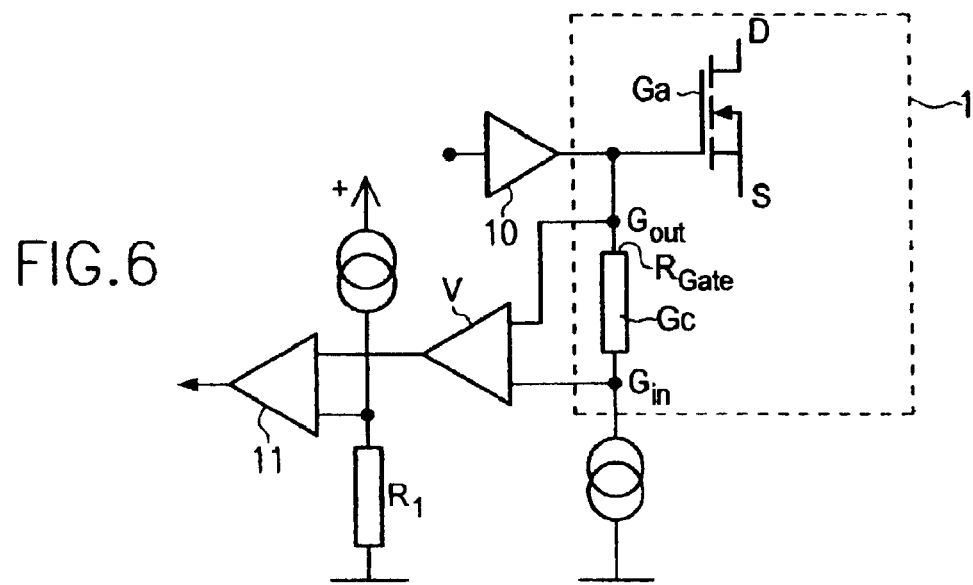
FIG. 6 is a circuit diagram of a further preferred exemplary embodiment for the temperature sensor according to the invention.

FIG. 6 shows a further circuit configuration for the temperature sensor having a MOS transistor 1, which in this case has individual gates Ga and Gc, wherein only the individual gate Gc with its resistor $R_{Gate}$ is operated as a temperature sensor between a gate input Gin and a gate output Gout. In this case, a gate driver 10 is connected to the individual gates Ga and Gc, while a differential amplifier V is connected by its inputs between the gate input Gin and the gate output Gout. The output of the differential amplifier V is fed to one input of a comparator 11, to whose other input the center point of a series circuit comprising a reference resistor $R_1$ and a voltage source is connected between reference-ground potential and positive voltage. In this case, the resistor $R_1$ is arranged at a sufficient distance from the MOS transistor 1 in order to be able to measure an undisturbed ambient temperature, and is preferably composed of the same material as the resistor $R_{Gate}$, that is to say in particular of polycrystalline silicon. Moreover, the reference resistor $R_1$ should be arranged on the same semiconductor chip as the resistor $R_{Gate}$ of the MOS transistor 1.

By way of such a reference resistor, it is possible to compensate for production fluctuations which inherently lead to different local resistances of the polycrystalline material from batch to batch.

Figure 7:
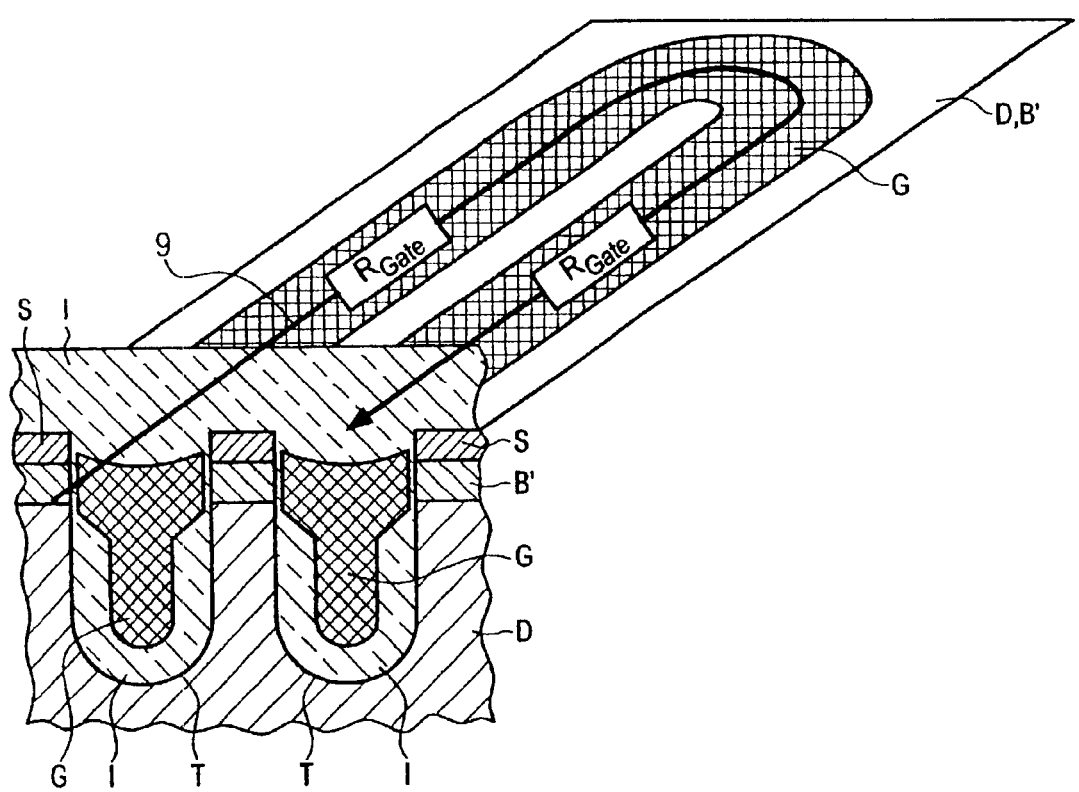
FIG. 7 is a partly perspective sectional illustration and a perspective plan view of a trench MOS transistor for explaining the invention.

Finally, FIG. 7 also shows, in a sectional illustration and a perspective plan view, a trench MOS transistor having a gate electrode G, which is located over an insulating layer I in a trench T. It should be noted that the insulating layer I actually comprises a plurality of individual layers, such as, for example, top oxide made of TEOS (tetraethylene orthosilicate) above the gate electrode G—constructed from polycrystalline silicon—and silicon dioxide and also silicon nitride at the trench walls and also on the surface of the semiconductor body with drain zone D, body zone B' and source zone S. The body zone B' has the opposite conductivity type to the source zone S and the drain zone D and is p-doped, for example. An arrow 9 indicates the current flow through the polycrystalline silicon with the resistor $R_{Gate}$ of the gate electrode G.

We claim:

1. A temperature sensor for a MOS circuit configuration, comprising:

at least one MOS transistor having a gate device with a gate input and a gate output, enabling a determination of a voltage drop between said gate input and said gate output, said MOS transistor being constructed from a plurality of cells; and said gate device being formed with a plurality of individual gates only partly electrically connected between said gate input and said gate output, only individual cells being provided with individual said gate devices serving for temperature measurement.

2. The temperature sensor according to claim 1, wherein a constant current flows between said gate input and said gate output.

3. The temperature sensor according to claim 1, wherein said gate device is composed of polycrystalline silicon.

4. The temperature sensor according to claim 1, which further comprises a reference resistor connected to at least one of said gate input and said gate output, with a resistance of said gate device between said gate input and said gate output being comparable with a resistance of said reference resistor.

5. The temperature sensor according to claim 4, wherein said reference resistor and said gate device of the MOS transistor are formed of identical material.

6. The temperature sensor according to claim 1, which comprises a transistor and a current generator connected between said gate input and said gate output.

7. The temperature sensor according to claim 6, wherein said current generator is a reference resistor.

8. The temperature sensor according to claim 4, wherein said reference resistor is a current generator.

9. The temperature sensor according to claim 1, wherein said gate device extends along a meandering path for increasing a resistance thereof.

10. The temperature sensor according to claim 1, which comprises means for increasing a resistance of said gate device.

11. The temperature sensor according to claim 1, wherein said MOS transistor is a trench transistor.

12. The temperature sensor as claimed claim 11, wherein said trench transistor is a DMOS transistor.

13. The temperature sensor according to claim 1, which further comprises a reference resistor commonly disposed with said MOS transistor on a common semiconductor chip, and said reference resistor and said gate device are formed of a common material.

14. The temperature sensor according to claim 13, wherein said common material is polycrystalline silicon.

15. The temperature sensor according to claim 1, wherein said gate device is formed with a given number n of individual gates, and a number m<n of the individual gates less than the given number of individual gates are connected between said gate input and said gate output.

* * * * *